(12) United States Patent
Lee et al.

(10) Patent No.: US 10,874,001 B2
(45) Date of Patent: Dec. 22, 2020

(54) COLOR TEMPERATURE VARIABLE LIGHT EMITTING DIODE MODULE, LIGHTING DEVICE USING THE LIGHT EMITTING DIODE MODULE AND METHOD FOR FABRICATING THE LIGHT EMITTING DIODE MODULE

(71) Applicant: LUMENS CO., LTD., Yongin-si (KR)

(72) Inventors: Jungwoo Lee, Yongin-si (KR);
Junhyung Lim, Yongin-si (KR);
Hyunpyo Hong, Yongin-si (KR); Jihye Chang, Yongin-si (KR)

(73) Assignee: LUMENS CO., LTD., Yongin-si (KR)

( * ) Notice: Subject to any disclaimer, the term of this patent is extended or adjusted under 35 U.S.C. 154(b) by 33 days.

(21) Appl. No.: 16/258,504

(22) Filed: Jan. 25, 2019

(65) Prior Publication Data

US 2019/0239308 A1 Aug. 1, 2019

(30) Foreign Application Priority Data

Jan. 26, 2018 (KR) .......................... 10-2018-0009908
Jul. 19, 2018 (KR) .......................... 10-2018-0083801

(51) Int. Cl.
*H05B 33/08* (2020.01)
*H05B 45/20* (2020.01)
(Continued)

(52) U.S. Cl.
CPC ........... *H05B 45/20* (2020.01); *F21V 23/007* (2013.01); *F21V 23/023* (2013.01); *H01L 33/50* (2013.01)

(58) Field of Classification Search
None
See application file for complete search history.

(56) References Cited

U.S. PATENT DOCUMENTS

2010/0219428 A1* 9/2010 Jung .......................... F21V 7/26
257/89
2014/0217899 A1* 8/2014 Kang ..................... H05B 45/48
315/122

(Continued)

*Primary Examiner* — Elmito Breval
(74) *Attorney, Agent, or Firm* — Mei & Mark LLP

(57) ABSTRACT

Disclosed is a color temperature variable light emitting diode module that is driven when alternating current power is applied thereto. The light emitting diode module includes: a substrate; and a plurality of light emitting diode groups arranged on a substrate and including a first light emitting diode group emitting light at an input voltage level equal to or above a first reference voltage and a second light emitting diode group emitting light at an input voltage level equal to or above a second reference voltage higher than the first reference voltage. The first light emitting diode group includes: a first light emitting diode unit consisting of one or more light emitting diodes connected in series with each other and a second light emitting diode unit connected in series with the first light emitting diode unit and consisting of one or more light emitting diodes connected in series with each other; first wavelength converting elements disposed on the corresponding light emitting diodes constituting the first light emitting diode unit and the second light emitting diode unit and converting primary light emitted from the first light emitting diode unit and the second light emitting diode unit into secondary light having a first color temperature; and second wavelength converting elements disposed on the first light emitting diode group, the first wavelength converting elements, and the second light emitting diode group and converting some or all of primary light emitted from the first light emitting diode group, primary light emitted from the second light emitting diode group, and the secondary light emitted through the first wavelength converting elements into tertiary light having a second color temperature. Mixed light of the secondary light and the (Continued)

tertiary light is emitted or either the secondary light or the tertiary light is emitted in response to an input voltage level.

20 Claims, 6 Drawing Sheets

(51) Int. Cl.
*H01L 33/50* (2010.01)
*F21V 23/02* (2006.01)
*F21V 23/00* (2015.01)

(56) References Cited

U.S. PATENT DOCUMENTS

| | | | |
|---|---|---|---|
| 2015/0245437 A1* | 8/2015 | Cho | H05B 45/46 |
| | | | 315/186 |
| 2015/0373792 A1* | 12/2015 | Kim | H05B 45/44 |
| | | | 315/201 |
| 2015/0373799 A1* | 12/2015 | Bong | H05B 45/10 |
| | | | 315/201 |
| 2016/0081145 A1* | 3/2016 | Peeters | H05B 45/20 |
| | | | 315/185 R |
| 2016/0113080 A1* | 4/2016 | Hsing Chen | H01L 25/0753 |
| | | | 315/186 |
| 2016/0284950 A1* | 9/2016 | Tseng | H01L 33/504 |
| 2017/0257916 A1* | 9/2017 | Sumitani | H05B 45/50 |
| 2017/0280527 A1* | 9/2017 | Lee | H05B 45/46 |
| 2017/0280532 A1* | 9/2017 | Akiyama | H05B 47/10 |
| 2017/0290111 A1* | 10/2017 | Akiyama | H05B 45/24 |

* cited by examiner (a)　　　　　　　　(b)

(a)　　　　　　　　(b)

COLOR TEMPERATURE VARIABLE LIGHT EMITTING DIODE MODULE, LIGHTING DEVICE USING THE LIGHT EMITTING DIODE MODULE AND METHOD FOR FABRICATING THE LIGHT EMITTING DIODE MODULE

BACKGROUND OF THE INVENTION

1. Field of the Invention

The present invention relates to a color temperature variable light emitting diode module, a lighting device using the light emitting diode module, and a method for fabricating the light emitting diode module. More specifically, the present invention relates to a color temperature variable light emitting diode module in which a plurality of light emitting diodes are driven when alternating current power is applied thereto and the color temperature of output light varies in response to an input voltage, a color temperature variable light emitting diode module in which a first light emitting diode group provided with fluorescent films and a second light emitting diode group encapsulated with an encapsulation layer including a phosphor are sequentially driven when alternating current power is applied thereto, a lighting device using any of the light emitting diode modules described herein, and a method for fabricating any of the light emitting diode modules described herein.

2. Description of the Related Art

In recent years, light emitting devices such as light emitting diodes (LEDs) have become increasingly used in various applications, including lighting and display. Particularly, light emitting diodes (LEDs) are small in size and have a long lifetime compared to conventional light sources. Light emitting diodes require low power consumption because they directly convert electrical energy into light energy. Accordingly, light emitting diodes have the advantages of high energy efficiency and fast response.

Light emitting diodes can be used to manufacture a color temperature variable lighting device such as a halogen lamp. In this case, a light emitting diode module is fabricated by mounting a plurality of light emitting diodes 11 on a substrate, applying a first encapsulant 12 including a first phosphor having a higher color temperature to a first area of the substrate, drying the first encapsulant, applying a second encapsulant 13 including a second phosphor having a lower color temperature to a second area of the substrate, and drying the second encapsulant, as illustrated in FIG. 1.

However, there is a difficulty in clearly dividing the areas corresponding to lower and higher color temperatures and applying the different encapsulants to the divided areas. Particularly, it is more difficult to accurately apply encapsulants to divided areas in a limited space such as a chip-on-board (COB) module.

A lighting device manufactured using encapsulants including two or more kinds of phosphors may have a large color temperature variation. The application of the encapsulants to divided areas should be repeated twice or more, involving increased processing time and cost.

SUMMARY OF THE INVENTION

The present invention has been made in an effort to solve the problems of the prior art, and it is one object of the present invention to provide a color temperature variable light emitting diode module which includes first wavelength converting elements disposed corresponding to light emitting diodes of a first light emitting diode group and second wavelength converting elements covering the light emitting diodes of the first light emitting diode group and the light emitting diodes of a second light emitting diode group and is constructed such that the first light emitting diode group and the second light emitting diode group are operated sequentially in response to an input voltage.

It is a further object of the present invention to provide a color temperature variable light emitting diode module including a plurality of light emitting diodes driven by the application of alternating current power that can provide a solution to difficulties encountered in fabricating conventional light emitting diode modules by applying a plurality of kinds of encapsulants to a plurality of divided areas and that can suppress its color temperature variation, a lighting device using the light emitting diode module, and a method for fabricating the light emitting diode module.

It is another object of the present invention to provide a color temperature variable light emitting diode module that can provide a solution to the problems of increased processing time and cost involved in fabricating conventional light emitting diode modules by repeatedly applying a plurality of kinds of encapsulants to a plurality of divided areas and drying the encapsulants, a lighting device using the light emitting diode module, and a method for fabricating the light emitting diode module.

Other detailed objects of the present invention will be recognized and appreciated from the following detailed description by those skilled in the art.

A light emitting diode module according to one aspect of the present invention is driven when alternating current power is applied thereto and includes: a substrate; and a plurality of light emitting diode groups arranged on a substrate and including a first light emitting diode group emitting light at an input voltage level equal to or above a first reference voltage and a second light emitting diode group emitting light at an input voltage level equal to or above a second reference voltage higher than the first reference voltage, wherein the first light emitting diode group includes: a first light emitting diode unit consisting of one or more light emitting diodes connected in series with each other and a second light emitting diode unit connected in series with the first light emitting diode unit and consisting of one or more light emitting diodes connected in series with each other; first wavelength converting elements disposed on the corresponding light emitting diodes constituting the first light emitting diode unit and the second light emitting diode unit and converting primary light emitted from the first light emitting diode unit and the second light emitting diode unit into secondary light having a first color temperature; and second wavelength converting elements disposed on the first light emitting diode group, the first wavelength converting elements, and the second light emitting diode group and converting some or all of primary light emitted from the first light emitting diode group, primary light emitted from the second light emitting diode group, and the secondary light emitted through the first wavelength converting elements into tertiary light having a second color temperature, and wherein mixed light of the secondary light and the tertiary light is emitted or either the secondary light or the tertiary light is emitted in response to an input voltage level inputted by the alternating current power.

According to one embodiment, the light emitting diode module further includes a control unit detecting the input voltage level inputted by the alternating current power to allow the first light emitting diode group and the second light emitting diode group to sequentially or selectively emit light in response to the input voltage level.

According to one embodiment, the light emitting diode module further includes a driver IC connected downstream of the first light emitting diode group and downstream of the second light emitting diode group to provide current paths when the first light emitting diode group and the second light emitting diode group emit light.

According to one embodiment, the light emitting diode module further includes: a first driver IC connected downstream of the first light emitting diode group wherein the first light emitting diode group is turned on to emit light when the input voltage level is higher than the first reference voltage but is lower than the second reference voltage and is turned off when the input voltage level is higher than the second reference voltage; and a second driver IC connected downstream of the second light emitting diode group wherein both the first light emitting diode group and the second light emitting diode group are turned on to emit light when the input voltage level is higher than the second reference voltage.

According to one embodiment, the light emitting diode module includes n (where n is an integer of 3 or more) light emitting diode groups and the n light emitting diode groups include the first light emitting diode group and the second light emitting diode group.

According to one embodiment, the light emitting diode module further includes: a rectifier circuit unit applying a voltage to the first light emitting diode group and the second light emitting diode group; a driver IC connected downstream of the first light emitting diode group and downstream of the second light emitting diode group to control current paths; and a switch unit located between the rectifier circuit unit and the driver IC to switch such that either the first light emitting diode group or the second light emitting diode group does not emit light despite a change in input voltage level.

According to one embodiment, the switch unit includes a first NMOS FET connected between downstream of the first light emitting diode group and the driver IC and a second NMOS FET connected between downstream of the second light emitting diode group and the driver IC; and a gate terminal of the first NMOS FET and a gate terminal of the second NMOS FET are connected to an output end of the rectifier circuit unit.

According to one embodiment, the gate terminal of the first NMOS FET is connected to a grounding end such that the switch unit switches to prevent the first light emitting diode group from emitting light despite a change in input voltage level.

According to one embodiment, the gate terminal of the second NMOS FET is connected to a grounding end such that the switch unit switches to prevent the second light emitting diode group from emitting light despite a change in input voltage level.

According to one embodiment, the first wavelength converting elements are disposed only on the first light emitting diode group.

A light emitting diode module according to a further aspect of the present invention is driven when alternating current power is applied thereto and includes: a substrate; a plurality of light emitting diode groups arranged on a substrate and including a first light emitting diode group emitting light at an input voltage level equal to or above a first reference voltage and a second light emitting diode group emitting light at an input voltage level equal to or above a second reference voltage higher than the first reference voltage; first wavelength converting elements disposed on the corresponding light emitting diodes of the first light emitting diode group and converting primary light emitted from the light emitting diodes of the first light emitting diode group into secondary light having a first color temperature; and an encapsulant including second wavelength converting elements and a resin, the second wavelength converting elements being disposed on the first light emitting diode group, the first wavelength converting elements, and the second light emitting diode group and converting some or all of primary light emitted from the first light emitting diode group, primary light emitted from the second light emitting diode group, and the secondary light emitted through the first wavelength converting elements into tertiary light having a second color temperature, wherein mixed light of the secondary light and the tertiary light is emitted or either the secondary light or the tertiary light is emitted in response to an input voltage level inputted by the alternating current power.

According to one embodiment, the light emitting diode module further includes a control unit detecting the input voltage level inputted by the alternating current power to allow the first light emitting diode group and the second light emitting diode group to sequentially or selectively emit light in response to the input voltage level.

According to one embodiment, the light emitting diode module further includes: a first driver IC connected downstream of the first light emitting diode group wherein the first light emitting diode group is turned on to emit light when the input voltage level is higher than the first reference voltage but is lower than the second reference voltage and is turned off when the input voltage level is higher than the second reference voltage; and a second driver IC connected downstream of the second light emitting diode group wherein both the first light emitting diode group and the second light emitting diode group are turned on to emit light when the input voltage level is higher than the second reference voltage.

According to one embodiment, the light emitting diode module further includes: a rectifier circuit unit applying a voltage to the first light emitting diode group and the second light emitting diode group; a driver IC connected downstream of the first light emitting diode group and downstream of the second light emitting diode group to control current paths; and a switch unit located between the rectifier circuit unit and the driver IC to switch such that either the first light emitting diode group or the second light emitting diode group does not emit light despite a change in input voltage level.

A light emitting diode module according to another aspect of the present invention is driven when alternating current power is applied thereto and includes: a substrate; a first light emitting diode group arranged on a substrate and including a plurality of light emitting diodes and first wavelength converting elements disposed corresponding to the light emitting diodes; a second light emitting diode group arranged on the substrate and including a plurality of light emitting diodes; and an encapsulation layer encapsulating the first light emitting diode group and the second light emitting diode group and including second wavelength converting elements, wherein the first light emitting diode group is driven at an input voltage level equal to or above a first reference voltage to emit light having a first color temperature and the first light emitting diode group and the second light emitting diode group are driven at a second reference voltage level higher than the first reference voltage to emit light having a second color temperature.

According to one embodiment, the first wavelength converting elements include wavelength converting materials converting light emitted from the light emitting diodes of the first light emitting diode group into red light and the second wavelength converting elements include wavelength converting materials producing white light in cooperation with the second light emitting diode group.

According to one embodiment, the light emitting diode module includes n (where n is an integer of 3 or more) light emitting diode groups and the n light emitting diode groups include the first light emitting diode group and the second light emitting diode group.

According to one embodiment, the first wavelength converting elements are disposed only on the light emitting diodes of the first light emitting diode group among the n (where n is an integer of 3 or more) light emitting diode groups.

According to one embodiment, the number of the light emitting diodes in the $n^{th}$ light emitting diode group is larger than the number of the light emitting diodes in the $(n-1)^{th}$ light emitting diode group.

According to one embodiment, the light emitting diode module further includes: a control unit adapted to detect the input voltage level; and a driver IC controlled by the control unit in response to the input voltage level detected by the control unit to allow the first light emitting diode group and the second light emitting diode group to sequentially emit light and connected downstream of the first light emitting diode group and downstream of the second light emitting diode group to provide current paths when the first light emitting diode group and the second light emitting diode group emit light.

A color temperature variable light emitting diode module according to another aspect the present invention drives a plurality of light emitting diodes when alternating current power is applied thereto and includes: a substrate mounted with the plurality of light emitting diodes; and a plurality of light emitting diode groups mounted on the substrate and sequentially driven in response to an input voltage level, wherein the plurality of light emitting diode groups include a first light emitting diode group including one or more of the light emitting diodes that are provided with fluorescent films and a second light emitting diode group including one or more of the light emitting diodes that are encapsulated with an encapsulation layer including a phosphor.

According to one embodiment, light emitted from the first light emitting diode group may have a lower color temperature than light emitted from the second light emitting diode group.

According to one embodiment, the fluorescent films of the first light emitting diode group may include a red phosphor and the second light emitting diode group may emit white light.

According to one embodiment, the encapsulation layer may encapsulate the light emitting diodes of the first light emitting diode group as well as the light emitting diodes of the second light emitting diode group.

According to one embodiment, the light emitting diode module may be a chip-on-board module in which a plurality of flip-chip type light emitting diodes are directly mounted on a substrate.

According to one embodiment, the light emitting diode module may further include a control unit sequentially operating the first light emitting diode group and the second light emitting diode group in response to the input voltage level.

According to one embodiment, the control unit may operate the first light emitting diode group when the input voltage level is higher than a first reference voltage but is lower than a second reference voltage and may operate the second light emitting diode group when the input voltage level is higher than the second reference voltage.

According to one embodiment, the color temperature variable light emitting diode module may have a structure in which the first light emitting diode group, the second light emitting diode group, . . . , and an $N^{th}$ (where N is a positive constant greater than 1) light emitting diode group are connected in series in this order, with the proviso that the number of the light emitting diodes in the $(n-1)^{th}$ (where n is a positive constant satisfying $1<n\le N$) light emitting diode group is equal to or larger than the number of the light emitting diodes in the $n^{th}$ light emitting diode group.

A lighting device according to another aspect of the present invention includes any of the color temperature variable light emitting diode modules described herein.

According to yet another aspect of the present invention, there is provided a method for fabricating a color temperature variable light emitting diode module driving a plurality of light emitting diodes mounted on a substrate when alternating current power is applied thereto, the method including: mounting one or more light emitting diodes provided with fluorescent films on the substrate to construct a first light emitting diode group; and mounting one or more light emitting diodes on the substrate and encapsulating the light emitting diodes with an encapsulation layer including a phosphor to construct a second light emitting diode group.

According to one embodiment, light emitted from the first light emitting diode group may have a lower color temperature than light emitted from the second light emitting diode group.

According to one embodiment, the encapsulation layer may encapsulate the light emitting diodes of the first light emitting diode group as well as the light emitting diodes of the second light emitting diode group.

According to one embodiment, the light emitting diode module may be a chip-on-board module in which a plurality of flip-chip type light emitting diodes are directly mounted on a substrate.

According to one embodiment, the method may further include constructing a control circuit sequentially driving the first light emitting diode group and the second light emitting diode group in response to an input voltage level.

The color temperature variable light emitting diode modules of the present invention are constructed such that a first light emitting diode group provided with first wavelength converting elements (e.g., fluorescent films) and a second light emitting diode group covered with second wavelength converting elements present in an encapsulation layer are sequentially driven when alternating current power is applied thereto. The color temperature variable light emitting diode modules can provide a solution to the problems of complex and difficult processing encountered in fabricating conventional light emitting diode modules by applying different encapsulants to a plurality of divided areas. In addition, the color temperature variable light emitting diode modules of the present invention can provide a solution to the problem of color temperature variations of final products caused by a plurality of divided areas having different color temperatures.

Furthermore, according to the method of the present invention, an encapsulant is applied only once. Therefore, the method of the present invention can provide a solution to the problems of increased processing time and cost involved in fabricating conventional light emitting diode modules by repeatedly applying different kinds of encapsulants to a plurality of divided areas.

BRIEF DESCRIPTION OF THE DRAWINGS

Me accompanying drawings are incorporated into and form a part of the specification to assist in understanding the present inventions. The accompanying drawings provide embodiments of the present invention and illustrate the spirit of the invention, together with the detailed description.

DETAILED DESCRIPTION OF THE INVENTION

Figure 1:
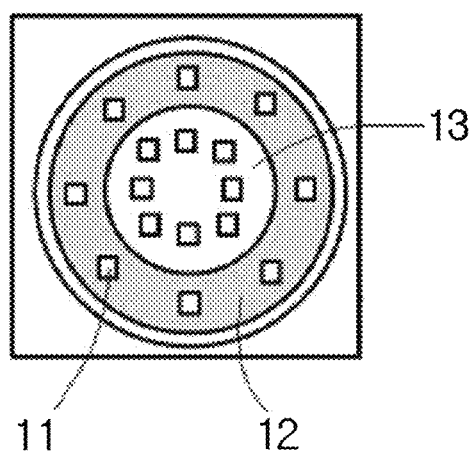
FIG. 1 is an exemplary view of a light emitting diode module according to the prior art.

Now, preferred embodiments of the present invention will be described in detail with reference to the accompanying drawings. In the drawings, the same or similar elements are denoted by the same reference numerals even though they are depicted in different drawings. In describing the present invention, if a detailed explanation for a related known function or construction is considered to unnecessarily divert the gist of the present invention, such explanation has been omitted. It should be understood that the embodiments are not intended to limit or restrict the spirit of the present invention and can be implemented by those skilled in the art.

Exemplary embodiments of color temperature variable light emitting diode modules 100 according to the present invention will be described in detail with reference to the accompanying drawings.

Figure 2:
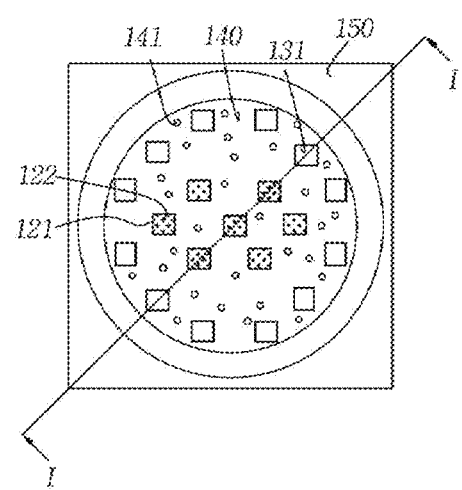
FIG. 2 is a plan view illustrating a color temperature variable light emitting diode module according to one embodiment of the present invention.
Figure 3:
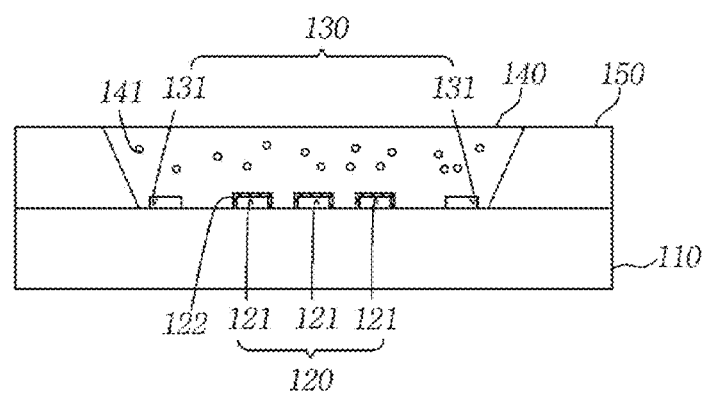
FIG. 3 is a cross-sectional view taken along line I-I of FIG. 2.

FIG. 2 is a plan view illustrating a color temperature variable light emitting diode module 100 according to one embodiment of the present invention and FIG. 3 is a cross-sectional view taken along line I-I of FIG. 2.

As illustrated in FIGS. 2 and 3, the color temperature variable light emitting diode module 100 includes a plurality of light emitting diodes 121 and 131. The plurality of light emitting diodes 121 and 131 emit light when alternating current power is applied thereto. The color temperature variable light emitting diode module 100 includes: a substrate 110 mounted with the plurality of light emitting diodes 121 and 131; and a plurality of light emitting diode groups 120 and 130 arranged on the substrate 110 and sequentially operated in response to an input voltage level.

The plurality of light emitting diode groups include a first light emitting diode group 120 and a second light emitting diode group 130. The first light emitting diode group 120 is operated at an input voltage level equal to or above a first reference voltage and the second light emitting diode group 130 is operated at an input voltage level equal to or above a second reference voltage higher than the first reference voltage.

The color temperature variable light emitting diode module 100 includes first wavelength converting elements 122 disposed corresponding to the light emitting diodes 121 of the first light emitting diode group 120 to convert light emitted from the first light emitting diode group 120 into light having a first color temperature and second wavelength converting elements 141 covering the light emitting diodes 121 of the first light emitting diode group 120 and the light emitting diodes 131 of the second light emitting diode group 130. The second wavelength converting elements 141 convert light emitted from the first light emitting diode group 120 and the second light emitting diode group 130 into light having a second color temperature in cooperation with the first wavelength converting elements 122.

The light emitting diodes 121 of the first light emitting diode group 120 emit blue or UV light. The first wavelength converting elements 122 are provided in the form of wavelength converting films (more specifically, phosphor films) covering the upper and side surfaces of the light emitting diodes 121 of the first light emitting diode group 120 to convert the wavelength of light emitted from the first light emitting diode group 120 into red light. The wavelength converting films may be formed using wavelength converting materials. Examples of such wavelength converting materials include red phosphors and quantum dots.

The light emitting diodes 131 of the second light emitting diode group 130 emit blue light. The first wavelength converting elements 122 are not disposed on the light emitting diodes 131 of the second light emitting diode group 130. Accordingly, light emitted from the light emitting diodes 131 of the second light emitting diode group 130 is directly transmitted to the second wavelength converting elements 141.

The light emitting diodes 121 and 131 are encapsulated with a light transmitting encapsulation layer 140 formed on the substrate 110. Wavelength converting materials such as yellow phosphor particles or quantum dots are distributed in the encapsulation layer 140 to convert the wavelength of light emitted from the light emitting diodes of the second light emitting diode group 130. Particularly, the wavelength converting materials convert blue light emitted from the light emitting diodes of the second light emitting diode group 130 into yellow light. The wavelength converting materials distributed in the encapsulation layer 140 constitute the second wavelength converting elements 141. The second wavelength converting elements 141 cover the first light emitting diode group 120 and the second light emitting diode group 130 in the encapsulation layer 140 and convert light emitted from the first light emitting diode group 120 and the second light emitting diode group 130 into light having a second color temperature in cooperation with the first wavelength converting elements 122.

In addition, the color temperature variable light emitting diode module 100 further includes a reflector 150 arranged on the substrate 110 and having a cavity in which the plurality of light emitting diode groups are accommodated. The reflector 150 provides a reflection plane from which light emitted from the first light emitting diode group 120 and the second light emitting diode group 130 are appropriately reflected, achieving improved luminescent properties. The encapsulation layer 140 is filled in the cavity and is thus easy to form.

As illustrated in FIG. 1, the conventional color temperature variable light emitting diode module is fabricated by mounting a plurality of light emitting diodes 11 on a substrate and sequentially applying encapsulants 12 and 13 including different types of phosphors to divided areas on the substrate. However, it is difficult to accurately apply the encapsulants to the divided areas, leading to a large color temperature variation of the final product. Further, the application and drying of the encapsulants should be repeated twice or more, involving increased processing time and cost.

Referring again to FIGS. 2 and 3, the first light emitting diode group 120 is mounted on the substrate 110. The light emitting diodes 121 are provided with the first wavelength converting elements 122. The first wavelength converting elements 122 are not disposed on the light emitting diodes 131 of the second light emitting diode group 130. The light emitting diodes 121 and the light emitting diodes 131 are encapsulated with the encapsulation layer 140 including the second wavelength converting elements 141. The color temperature variable light emitting diode module 100 is constructed such that the first light emitting diode group 120 and the second light emitting diode group 130 are sequentially driven in response to an input voltage level. This construction avoids the need to apply different encapsulants to a plurality of divided areas to suppress the color temperature variation of the final product, unlike in the fabrication of the conventional color temperature variable light emitting diode module. Furthermore, the light emitting diode module 100 can provide a solution to the problems of increased processing time and cost involved in fabricating the conventional light emitting diode module by repeatedly applying different encapsulants to a plurality of divided areas and drying the encapsulants.

A more detailed description will be given concerning the individual elements of the color temperature variable light emitting diode module 100.

The plurality of light emitting diodes 121 and 131 are mounted on the substrate 110. The substrate 110 may be a general printed circuit board (PCB) made of a dielectric material. A circuit pattern may be formed on the substrate 110 to operate the plurality of light emitting diodes.

The plurality of light emitting diodes 121 and 131 are light emitting diode chips directly mounted on the substrate 110 without using any package structure. In other words, the color temperature variable light emitting diode module 100 is provided in the form of a chip-on-board (COB) module including a substrate and light emitting diode chips directly mounted on the substrate. The light emitting diodes 121 of the first light emitting diode group 120 are preferably UV or blue light emitting diode chips. The light emitting diodes 131 of the second light emitting diode group 130 are preferably blue light emitting diode chips.

Each of the light emitting diode chips of the first light emitting diode group 120 may be a flip-chip type. Thus, wavelength converting materials such as phosphor particles or quantum dots are provided in the form of films or layers on the upper surfaces of the light emitting diode chips to constitute the first wavelength converting elements 122. Electrode pads are disposed on the lower surfaces of the light emitting diode chips and are electrically connected to the circuit pattern for driving the light emitting diode chips. A large number of flip-chip type light emitting diode chips can be mounted in a limited space and prevent heat dissipation efficiency from deterioration caused by their packaging. That is, the use of flip-chip type light emitting diode chips is effective in improving heat dissipation efficiency. In addition, the use of flip-chip type light emitting diode chips eliminates the need for bonding wires. This is advantageous in terms of processing, avoids the risk that bonding wires fall off, and offers many advantages associated with the formation of the first wavelength converting elements 122 on the upper surfaces of the light emitting diode chips. Preferably, each of the light emitting diode chips of the second light emitting diode group 130 is of a flip-chip type.

The substrate 110 is a metal PCB through which heat generated from high-power light emitting diodes for lighting can be effectively dissipated to the outside. When the light emitting diode chips are directly mounted on the metal substrate, heat generated from the light emitting diode chips can be more effectively dissipated to the outside through the metal substrate.

The first wavelength converting elements 122 are disposed in the form of films on the upper surfaces of the corresponding light emitting diodes 121 of the first light emitting diode group 120 and include wavelength converting materials such as red phosphor particles or quantum dots.

The first light emitting diode group 120 may also be arranged in specific assigned areas of the substrate 110, as illustrated in FIG. 2. The first light emitting diode group 120 may include a first light emitting diode unit (120_1 in FIG. 6) consisting of one or more light emitting diodes connected in series with each other and a second light emitting diode unit (120_2 in FIG. 6) connected in series with the first light emitting diode unit and consisting of one or more light emitting diodes connected in series with each other. The first light emitting diode unit and the second light emitting diode unit can be sequentially operated in response to an input voltage level.

The color temperature variable light emitting diode module emits light having a first color temperature when only the first light emitting diode group 120 is operated. The first color temperature is determined depending on light emitted from the light emitting diodes 121 of the first light emitting diode group 120 and light emitted through the first wavelength converting elements 122.

The color temperature variable light emitting diode module emits light having a second color temperature when the first light emitting diode group 120 and the second light emitting diode group 130 are operated simultaneously. The second color temperature is determined depending on light emitted from the light emitting diodes 121 of the first light emitting diode group 120, light emitted through the first wavelength converting elements 122, light emitted from the light emitting diodes 131 of the second light emitting diode group 130, and light emitted through the second wavelength converting elements 141 covering the first light emitting diode group 120 and the second light emitting diode group 130 in the encapsulation layer 140.

The second light emitting diode group 130 may also be arranged in specific assigned areas of the substrate 110, as illustrated in FIG. 2.

The light emitting diodes 131 of the second light emitting diode group 130 are encapsulated with the encapsulation layer 140 including the second wavelength converting elements 141 such as phosphor particles or quantum dots. Light emitted from the light emitting diodes 131 of the second light emitting diode group 130 is mixed with light emitted through the second wavelength converting elements 141 to produce white light, which is combined with the light produced by the first light emitting diode group and the first wavelength converting elements to produce light having a second color temperature.

As describe above, the application of encapsulants including different types of phosphors to a plurality of divided areas in the fabrication of the conventional color temperature variable light emitting diode module causes a large color temperature variation of the color temperature variable light emitting diode module. Further, the repeated application and drying of the encapsulants twice or more involve increased processing time and cost. In contrast, in the color temperature variable light emitting diode module 100, the light emitting diodes 121 of the first light emitting diode group 120 are provided with the first wavelength converting elements 122, the light emitting diodes 131 of the second light emitting diode group 130 are not provided with the first wavelength converting elements 122, and the first light emitting diode group 120 and the second light emitting diode group 130 are encapsulated with the encapsulation layer 140 including the second wavelength converting elements 141. Accordingly, the color temperature variable light emitting diode module 100 can provide a solution to difficulties encountered in applying a plurality of kinds of encapsulants to a plurality of divided areas and can suppress its color temperature variation. Furthermore, the color temperature variable light emitting diode module 100 can provide a solution to the problems of increased processing time and cost involved in fabricating the conventional light emitting diode module by repeatedly applying different encapsulants to a plurality of divided areas and drying the encapsulants.

The color temperature variable light emitting diode module 100 is constructed such that the first light emitting diode group 120 and the second light emitting diode group 130 are sequentially driven in response to an input voltage level.

Light emitted from the first light emitting diode group 120 may have a lower color temperature than light emitted from the second light emitting diode group 130.

For example, the first wavelength converting elements 122 disposed on the corresponding light emitting diodes 121 of the first light emitting diode group 120 include red wavelength converting materials (particularly, red phosphor particles) and the second wavelength converting elements 141 include wavelength converting materials that can produce white light in cooperation with the second light emitting diode group 130. This allows light produced in cooperation of the first light emitting diode group 120 with the first wavelength converting elements 122 when only the first light emitting diode group 120 is operated to have a lower color temperature than light produced by the interaction between the first light emitting diode group 120 and the first wavelength converting elements 122 and the interaction between the second light emitting diode group 130 and the second wavelength converting elements 141, making the color temperature of light emitted from the light emitting diode module 100 variable.

More specifically, the first light emitting diode group 120 is constructed using the UV light emitting diodes 121 provided with the first wavelength converting elements 122 in the form of films including a red phosphor, the second light emitting diode group 130 is constructed using the blue light emitting diodes 131 without providing the first wavelength converting elements 122, and the UV light emitting diodes 121 and the blue light emitting diodes 131 are encapsulated with the encapsulation layer 140 including the second wavelength converting elements 141 including a yellow phosphor. Due to this construction, the first light emitting diode group 120 is turned on to emit light having a low color temperature (e.g., red light) at an input voltage exceeding a first reference voltage and the second light emitting diode group 130 is turned on to emit light having a second color temperature higher than the first color temperature at an input voltage exceeding a second reference voltage. Meanwhile, the second light emitting diode group 130 is turned off at an input voltage lower than a second reference voltage and the first light emitting diode group 120 is turned off at an input voltage lower than the first reference voltage.

The color temperature variable light emitting diode module 100 has a color temperature similar to that of a general halogen lamp at a low illuminance.

In this embodiment, the type of the light emitting diodes 121 of the first light emitting diode group 120 is different from that of the light emitting diodes 131 of the second light emitting diode group 130. However, the same type of the light emitting diodes 121 and the light emitting diodes 131 may also be used. For example, the light emitting diodes 121 and the light emitting diodes 131 may be blue light emitting diodes or UV light emitting diodes.

Figure 10:
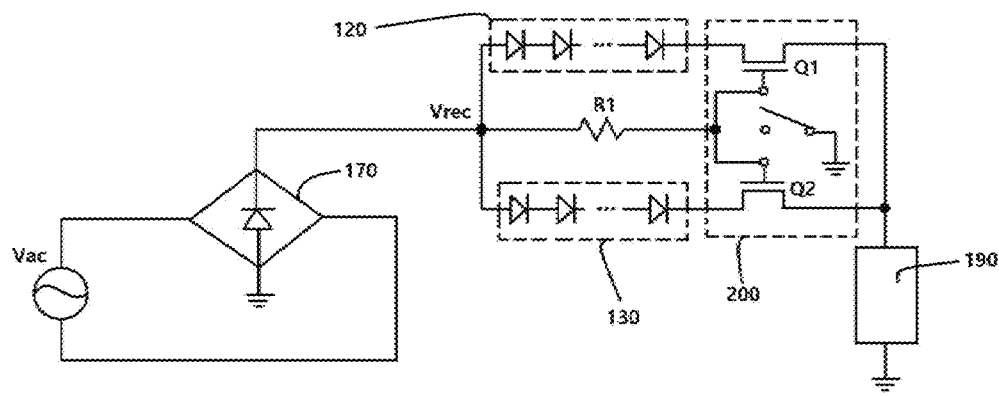
FIG. 10 illustrates a color temperature variable light emitting diode module according to another embodiment of the present invention.

A rectifier circuit unit 170 provides an input voltage (Vrec) level to the light emitting diodes 120 and 130. When the input voltage (Vrec) level exceeds a first reference voltage, the first light emitting diode group 120 is turned on. When the input voltage (Vrec) level exceeds a second reference voltage, the second light emitting diode group 120 is turned on in a state in which the first light emitting diode group 120 is turned on. Alternatively, the second light emitting diode group 120 may be turned on in a state in which the first light emitting diode group 120 is turned off. In this case, either the first light emitting diode group or the second light emitting diode group can be selected by a switch unit denoted by reference numeral 200, as illustrated in FIG. 10.

Figure 4:
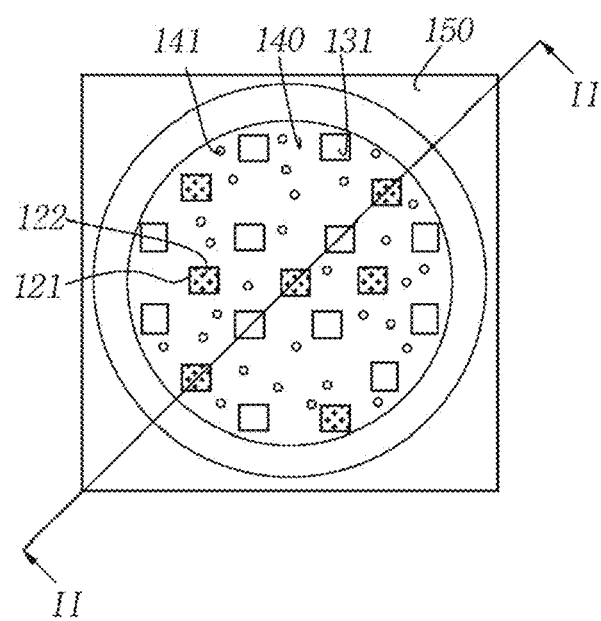
FIG. 4 is a plan view illustrating a color temperature variable light emitting diode module according to a further embodiment of the present invention.
Figure 5:
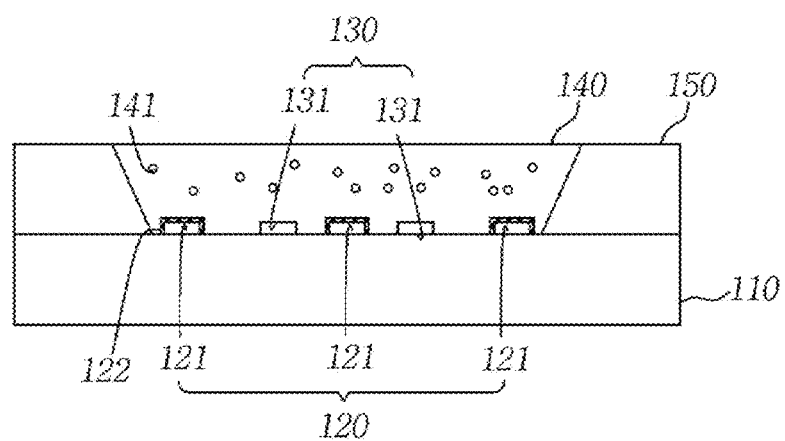
FIG. 5 is a cross-sectional view taken along line II-II of FIG. 4.

The light emitting diodes 121 of the first light emitting diode group 120 and the light emitting diodes 131 of the second light emitting diode group 130 do not need to be separately mounted on divided areas. As illustrated in FIGS. 4 and 5, the plurality of light emitting diodes 121 and 131 may also be mounted randomly on the substrate 110.

In the conventional color temperature variable light emitting diode module illustrated in FIG. 1, the encapsulants 12 and 13 including different kinds of phosphors are separately applied to divided areas of the plurality of light emitting diodes 11. In contrast, the color temperature of the color temperature variable light emitting diode module 100 of the present invention can be controlled by the first wavelength converting elements 122 disposed on the corresponding light emitting diodes 121 of the first light emitting diode group 120. Accordingly, the light emitting diodes 121 of the first light emitting diode group 120 and the light emitting diodes 131 of the second light emitting diode group 130 are arranged randomly without the need to divide their areas so that light emitted from the first light emitting diode group 120 and light emitted from the second light emitting diode group 130 can be uniformly mixed without bias over the entire area, achieving improved light uniformity.

The color temperature variable light emitting diode module 100 may further include a control unit (160 FIG. 6) sequentially operating the first light emitting diode group 120 and the second light emitting diode group 130 in response to the input voltage (Vrec) level.

The sequential operation of a plurality of light emitting diode groups 120, 130, 180a, and 180b using the control unit 160 for light emission will be explained in more detail with reference to FIG. 6.

The color temperature variable light emitting diode module 100 is operated when alternating current (AC) power is applied thereto. To this end, the color temperature variable light emitting diode module 100 may include a rectifier circuit unit 170 for rectification (for example, wave rectification) of the alternating current power. Other circuits may also be used instead of the wave rectifier circuit.

The control unit 160 detects the input voltage (Vrec) level applied to the light emitting diode groups 120, 130, 180a, and 180b through the rectifier circuit unit 170 and allows the light emitting diode groups 120, 130, 180a, and 180b to sequentially emit light depending on the detected input voltage (Vrec) level.

More specifically, when the input voltage (Vrec) level increases to a higher level than a first reference voltage at which the first light emitting diode group 120 can be operated to emit light, the control unit 160 detects the increased input voltage (Vrec) level and turns on a first switch SW1 to allow the first light emitting diode group 120 to emit light. When the input voltage (Vrec) level increases to a higher level than a second reference voltage at which the second light emitting diode group 130 can be operated to emit light, the control unit 160 detects the increased input voltage (Vrec) level and turns off the first switch SW1 and turns on a second switch SW2, with the result that the first light emitting diode group 120 and the second light emitting diode group 130 are connected in series to each other such that the light emitting diode groups 120 and 130 are operated simultaneously to emit light.

When the input voltage (Vrec) level further increases to a higher level than a voltage at which the third light emitting diode group 180a and the fourth light emitting diode group 180b can be operated to emit light, only the last one SW4 of the switches SW1, SW2, SW3, and SW4 in the driver IC 190 is controlled to be turned on and the other switches SW1, SW2, and SW3 are controlled to be turned off by the control unit 160 such that all light emitting diode groups are connected in series to one another and can be operated to emit light. The turn on/off operations of the switches are controlled by the control unit 160. Each of the switches SW1, SW2, SW3, and SW4 in the driver IC 190 is turned on to provide a current path such that the upstream connected light emitting diode group emits light. The amounts of the current flowing through the current paths provided by the driver IC 190 are also controllable. Thus, the provision of current paths and the control of current paths are used interchangeably herein in describing the functions of the driver IC 190. In the description of the present invention, it should be noted that each of the switches in the driver IC 190 often refers to the driver IC.

The switches SW1, SW2, SW3, and SW4 in the driver IC 190 may be N-metal oxide semiconductor field effect transistors (NMOS FETs) but are not limited thereto.

In the previous embodiment, the light emitting diode groups including the first light emitting diode group 120 and the second light emitting diode group 130 are controlled in response to the input voltage (Vrec) level to make the color temperature variable. The description has focused on this construction but is not limited thereto.

The color temperature variable light emitting diode module illustrated in FIGS. 2 to 5 includes only two light emitting diode groups 120 and 130. Now, a description will be given of a color temperature variable light emitting diode module including four light emitting diode groups 120, 130, 180a, and 180b.

Figure 6:
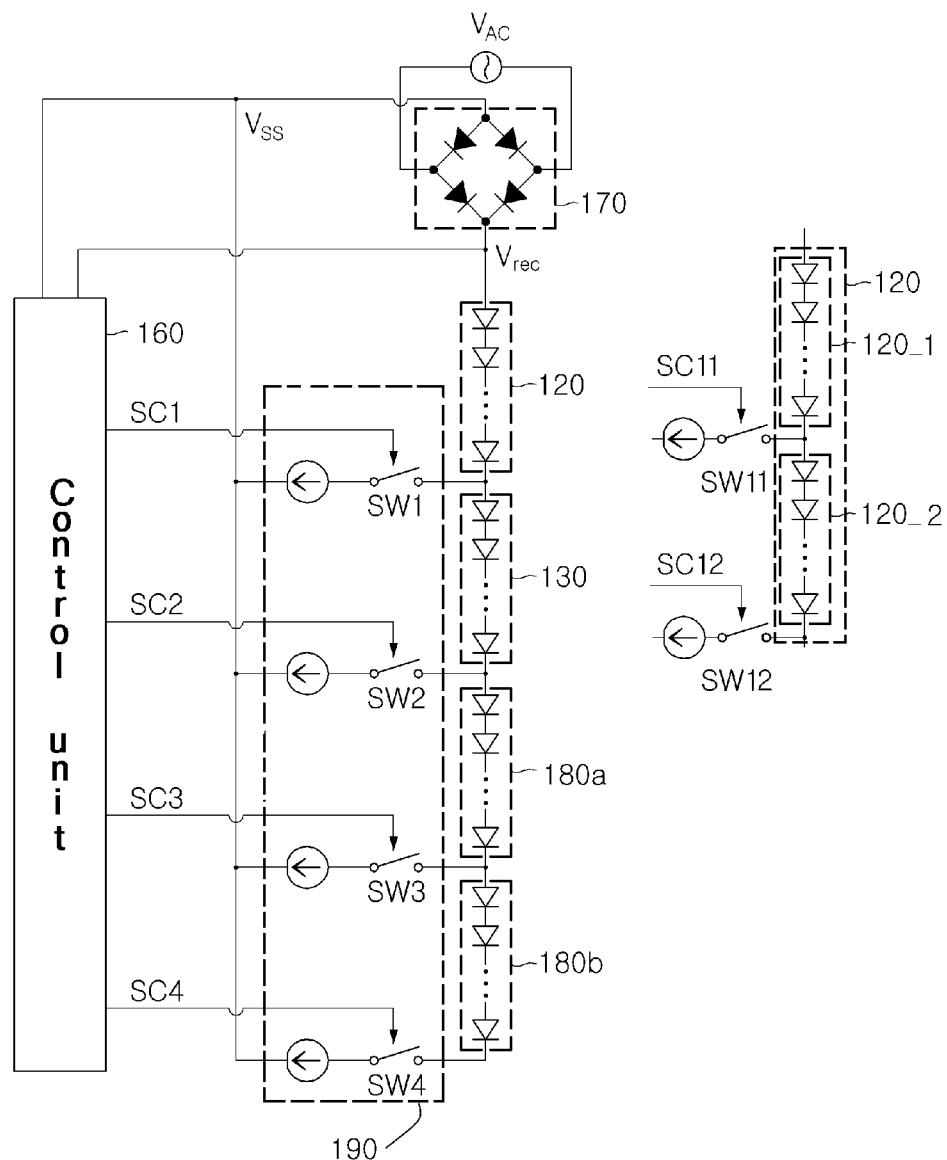
FIG. 6 illustrates the operation of a color temperature variable light emitting diode module including a control unit according to a further embodiment of the present invention.
Figure 7:
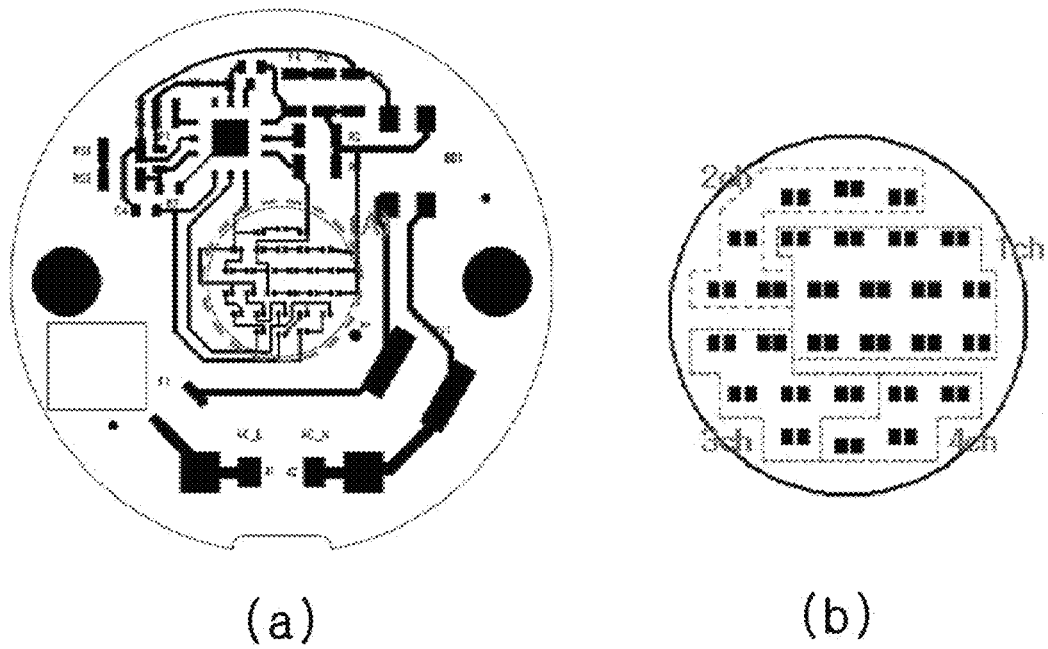
FIGS. 7 and 8 illustrate several examples of color temperature variable light emitting diode modules including two or more light emitting diode groups.
Figure 8:
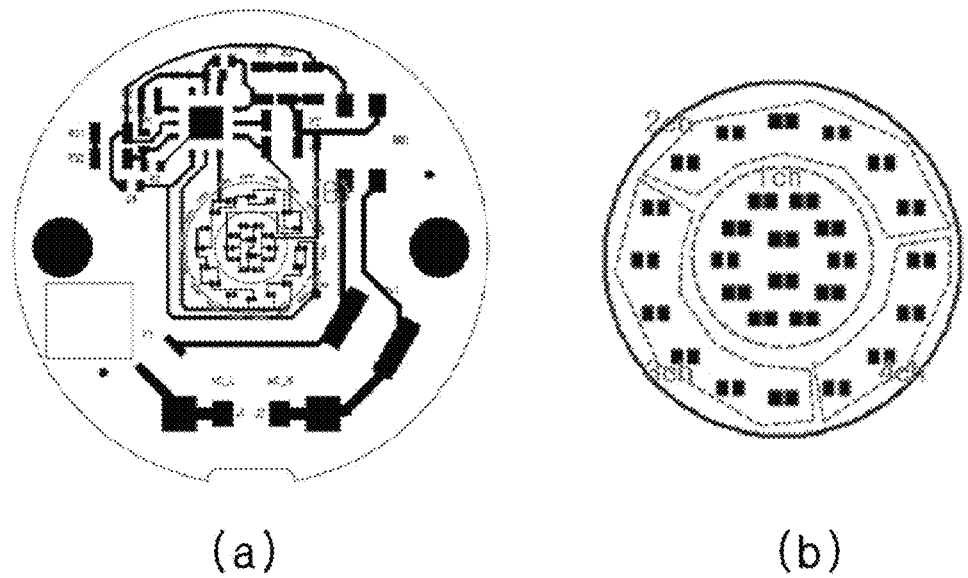

FIG. 6 is an exemplary equivalent circuit diagram of the color temperature variable light emitting diode module 100. FIGS. 7 and 8 show arrangements of the plurality of light emitting diode groups in the color temperature variable light emitting diode module 100.

Referring first to FIGS. 6 and 7, a plurality of light emitting diode groups including a first light emitting diode group 120 and a second light emitting diode group 130 are mounted in area (A) and a power supply circuit together with a control unit 160 and a driver IC 190 for sequentially driving the plurality of light emitting diode groups, may be mounted in the other areas (see (a) of FIG. 7).

As mentioned earlier, the first light emitting diode group 120 includes a first light emitting diode unit 120_1 and a second light emitting diode unit 120_2 that may be sequentially operated in response to an input voltage level. To this end, the driver IC including switches SW11 and SW12 for controlling current paths may be provided downstream of the first light emitting diode unit 120_1 and downstream of the second light emitting diode unit 120_2, respectively.

(b) of FIG. 7 shows an arrangement of the plurality of light emitting diode groups mounted in the area (A). The first light emitting diode group 120 (1ch in (b) of FIG. 7) may be mounted in one area of the substrate 110. The second light emitting diode group 130 (2ch in (b) of FIG. 7), the third light emitting diode group 180a (3ch in (b) of FIG. 7), and the fourth light emitting diode group 180b (4ch in (b) of FIG. 7) may be arranged in the other divided areas. First wavelength converting elements 122 (see FIG. 3) may be disposed on the corresponding light emitting diodes of the first light emitting diode group 120. The other light emitting diode groups may be encapsulated with an encapsulation layer 140 (see FIG. 3) including second wavelength converting elements 141 (see FIG. 3) without first wavelength converting elements. The first light emitting diode group 120 is also encapsulated with the encapsulation layer 140 (see FIG. 3).

Referring to FIG. 6 together with FIG. 8, the plurality of light emitting diode groups including the first light emitting diode group 120 and the second light emitting diode group 130 may be mounted in area (B) and a power supply circuit together with the control unit 160 and the driver IC 190 for sequentially driving the plurality of light emitting diode groups may be mounted in the other areas (see (a) of FIG. 8).

More specifically, (b) of FIG. 8 shows an arrangement of the plurality of light emitting diode groups mounted in the area (B). The first light emitting diode group 120 (1ch in (b) of FIG. 7) may be mounted in the central area of the substrate 110. The second light emitting diode group 130 (2ch in (b) of FIG. 8), the third light emitting diode group 180a (3ch in (b) of FIG. 8), and the fourth light emitting diode group 180b (4ch in (b) of FIG. 8) may be sequentially arranged in divided areas surrounding the area (B). First wavelength converting elements 122 (see FIG. 3) may be disposed on the corresponding light emitting diodes of the first light emitting diode group 120. The other light emitting diode groups may be encapsulated with an encapsulation layer 140 (see FIG. 3) including second wavelength converting elements 141 (see FIG. 3) without first wavelength converting elements. The first light emitting diode group 120 is also encapsulated with the encapsulation layer 140 (see FIG. 3).

Taking into consideration the dimensions of the color temperature variable light emitting diode module 100, arrangements other than those exemplified in (b) of FIG. 7 and (b) of FIG. 8 are also possible.

The color temperature variable light emitting diode module 100 may have a structure in which the first light emitting diode group 120, the second light emitting diode group 130, . . . , and an $n^{th}$ (where n is a positive integer greater than 3) light emitting diode group are connected in series in this order, with the proviso that the number of the light emitting diodes in the $(n-1)^{th}$ light emitting diode group is equal to or larger than the number of the light emitting diodes in the $n^{th}$ light emitting diode group.

More specifically, the first light emitting diode group 1ch includes the greatest number (12) of light emitting diodes, the second light emitting diode group 2ch includes 6 light emitting diodes, the third light emitting diode group 3ch includes 6 light emitting diodes, and the fourth light emitting diode group 4ch includes 4 light emitting diodes. That is, the number of light emitting diodes in the upstream $(n-1)^{th}$ light emitting diode group is equal to or greater than the number of light emitting diodes in the downstream $n^{th}$ light emitting diode group. With this arrangement, when the input voltage level increases, the plurality of light emitting diode groups can be sequentially driven, achieving improved efficiency of the color temperature variable light emitting diode module.

One embodiment of the present invention provides a lighting device including any of the color temperature variable light emitting diode modules 100 described herein. Due to the presence of the color temperature variable light emitting diode module 100, the color temperature of light emitted from the lighting device can be controlled depending on an input voltage, a value set by a user, operating environment, etc.

Figure 9:
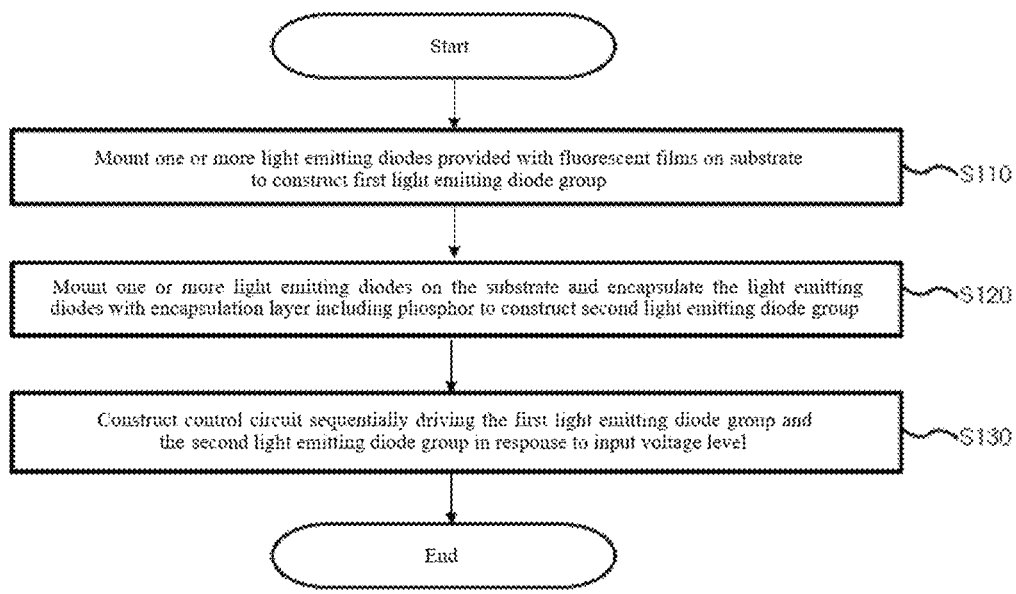
FIG. 9 is a flowchart illustrating a method for fabricating a color temperature variable light emitting diode module according to one embodiment of the present invention.

FIG. 9 is a flowchart illustrating a method for fabricating a color temperature variable light emitting diode module according to one embodiment of the present invention.

The method enables the fabrication of a color temperature variable light emitting diode module 100 that drives a plurality of light emitting diode groups 121 and 131 mounted on a substrate 110 when alternating current power is applied thereto. Referring to FIGS. 3, 6, and 9, the method includes: mounting one or more light emitting diodes 121 provided with first wavelength converting elements 122 on a substrate 110 to construct a first light emitting diode group 120 (S110); and forming an encapsulation layer 140 including second wavelength converting elements 141 on the substrate and covering light emitting diodes 131 mounted without the first wavelength converting elements 122 on the substrate 110 to construct a second light emitting diode group 130 (S120). The method may further include constructing a control circuit (including a control unit and a driver IC) sequentially driving the first light emitting diode group 120 and the second light emitting diode group 130 in response to an input voltage level (S130).

Hereinafter, the individual steps of the method will be described. A further description of the same elements as described in the color temperature variable light emitting diode module 100 is omitted and only features of the method will be mainly described.

First, one or more light emitting diodes 121 provided with first wavelength converting elements 122 are mounted on a substrate 110 to construct a first light emitting diode group 120 (S110). Any suitable process for appropriately mounting the light emitting diodes 121 provided with the first wavelength converting elements 122 on the substrate 110 may be used without particular limitation in step S110.

Subsequently, light emitting diodes 131 are mounted on the substrate 110, and the light emitting diodes 121 and 131 mounted on the substrate 110 are encapsulated with an encapsulation layer 140 including second wavelength converting elements 141 to construct a second light emitting diode group 130 (S120). Any suitable process for appropriately mounting the light emitting diodes 131 on the substrate 110 and encapsulating the light emitting diodes 121 and 131 with the encapsulation layer 140 including the second wavelength converting elements 141 may be used without particular limitation in step S120.

The first wavelength converting elements 122 may include wavelength converting materials that allow light emitted from the first light emitting diode group 120 to have a lower color temperature than light emitted from the second light emitting diode group 130.

For example, the first wavelength converting elements 122 include a red phosphor and the second light emitting diode group 130 emits white light in cooperation with the second wavelength converting elements 141. The use of the first and second wavelength converting elements allows light emitted from the first light emitting diode group 120, i.e. light produced from the first light emitting diode group 120 in cooperation with the first wavelength converting elements 122, to have a lower color temperature than light emitted from the second light emitting diode group 130, i.e. light produced by the interaction between the first light emitting diode group 120 and the first wavelength converting elements 122 and the interaction between the second light emitting diode group 130 and the second wavelength converting elements 141, with the result that the color temperature of light emitted from the color temperature variable light emitting diode module 100 can be controlled to be variable.

More specifically, the first light emitting diode group 120 is constructed using the UV light emitting diodes 121 provided with the first wavelength converting elements 122 including a red phosphor, the second light emitting diode group 130 is constructed by encapsulating the blue light emitting diodes 131 with the encapsulation layer 140 including the second wavelength converting elements 141 including a yellow phosphor. Due to this construction, the first light emitting diode group 120 is turned on to emit light having a low color temperature (e.g., red light) at an input voltage exceeding a first reference voltage and the second light emitting diode group 130 is turned on to emit light having a second color temperature (e.g., white or blue light) at an input voltage exceeding a second reference voltage. Meanwhile, the second light emitting diode group 130 and the first light emitting diode group 120 are sequentially turned off when the input voltage is lowered.

The color temperature variable light emitting diode module 100 has characteristics similar to those of a general halogen lamp at a low illuminance.

In step S120, the light emitting diodes 121 of the first light emitting diode group 120 as well as the light emitting diodes 131 of the second light emitting diode group 130 are encapsulated by the encapsulation layer.

The color temperature variable light emitting diode module 100 fabricated by the method of the present invention may be a chip-on-board module in which a plurality of flip-chip type light emitting diodes are directly mounted on a substrate.

Thus, according to the method of the present invention, a large number of light emitting devices can be mounted in a limited space of the substrate 110 and prevent heat dissipation efficiency from deterioration caused by their packaging.

Finally, the method of the present invention may further include constructing a control circuit (including a control unit and a driver IC) sequentially driving the first light emitting diode group and the second light emitting diode group in response to an input voltage level (S130).

The control circuit is provided on the upper or lower surface of the substrate 110. Alternatively, the control circuit may be provided in the form of a separate module. In this case, the control circuit may be connected to the substrate 110 through a cable or catheter.

FIG. 10 illustrates a color temperature variable light emitting diode module according to another embodiment of the present invention. Referring to FIG. 10, the color temperature variable light emitting diode module includes a rectifier circuit unit 170, a driver IC 190, and light emitting diode groups 120 and 130. As described in the foregoing embodiments, the driver IC 190 is controlled by a control unit (not illustrated). The color temperature variable light emitting diode module includes a switch unit 200 located between the rectifier circuit unit 170 and the driver IC 190. The switch unit 200 is operated to switch such that either the first light emitting diode group 120 or the second light emitting diode group 130 does not emit light despite a change in input voltage (Vrec) level. The switch unit 200 may be located upstream of the light emitting diode groups 120 and 130 but is more preferably located between the light emitting diode groups 120 and 130 and the driver IC 190 taking into consideration efficient driving of the light emitting diode groups 120 and 130 by the driver IC 190 (specifically, the size and capacity of transistors in the driver IC 190), as illustrated in FIG. 10.

The switch unit 200 includes a first NMOS FET Q1 connected between downstream of the first light emitting diode group 120 and the driver IC 190 and a second NMOS FET Q2 connected between downstream of the second light emitting diode group 130 and the driver IC 190. A gate terminal of the first NMOS FET Q1 and a gate terminal of the second NMOS FET Q2 may be connected to an output end Vrec of the rectifier circuit unit 170. The output end Vrec of the rectifier circuit unit 170 to which the gate terminals of the switches are connected is an input node of the light emitting diode groups 120 and 130.

The switch unit 200 can be operated to switch such that the first light emitting diode group 120 does not emit light irrespective of an input voltage (Vrec) level. That is, when the switch unit 200 switches to connect the gate terminal of the first NMOS FET to a grounding end, the first NMOS FET is turned off. Accordingly, the first light emitting diode group 120 does not emit light despite a change in input voltage (Vrec) level.

The switch unit 200 can be operated to switch such that the second light emitting diode group 130 does not emit light irrespective of an input voltage (Vrec) level. That is, when the switch unit 200 switches to connect the gate terminal of the second NMOS FET to a grounding end, the second NMOS FET is turned off. Accordingly, the second light emitting diode group 130 does not emit light despite a change in input voltage (Vrec) level.

In conclusion, the switch unit 200 can be used to allow the light emitting diode groups 120 and 130 to selectively emit light. This construction makes the color temperature of the light emitting diode module 100 variable.

For example, when the gate terminal of the second NMOS FET Q2 is grounded such that only 1Ch (i.e. the first light emitting diode group 120) is operated to emit light, the color temperature reaches 3000 K. When the gate terminal of the first NMOS FET Q1 is grounded such that only 2Ch (i.e. the second light emitting diode group 130) is operated to emit light, the color temperature reaches 3500 K. When the gate terminal of the first NMOS FET Q1 and the gate terminal of the second NMOS FET Q2 are not grounded, both are turned on. Accordingly, the light emitting diode groups 120 and 130 are operated to emit light in response to an input voltage (Vrec) level, and as a result, the color temperature reaches 4000 K.

Although the color temperature variable light emitting diode modules have been described herein with reference to the accompanying drawings, the drawings and the description are not construed to limit the scope of the present invention.

What is claimed is:

1. A color temperature variable light emitting diode module that is driven when alternating current power is applied thereto, comprising:
   a substrate;
   a plurality of light emitting diode groups arranged on the substrate and comprising a first light emitting diode group emitting light at an input voltage level equal to or above a first reference voltage and a second light emitting diode group emitting light at an input voltage level equal to or above a second reference voltage higher than the first reference voltage; and
   a control unit connected between the alternating current power and the plurality of light emitting diode groups to detect the input voltage level inputted by the alternating current power,
   wherein the first light emitting diode group comprises:
   a first light emitting diode unit comprising one or more light emitting diodes connected in series with each other and a second light emitting diode unit connected in series with the first light emitting diode unit and comprising one or more light emitting diodes connected in series with each other; and
   first wavelength converting elements disposed on the corresponding one or more light emitting diodes of the first light emitting diode group and configured to convert primary light emitted from the one or more light emitting diodes of the first light emitting diode group into secondary light having a first color temperature,
   wherein the light emitting diode module further comprises second wavelength converting elements disposed on the first light emitting diode group, the first wavelength converting elements, and the second light emitting diode group, the second wavelength converting element being configured to convert some or all of primary light emitted from the first light emitting diode group, primary light emitted from the second light emitting diode group, and the secondary light emitted through the first wavelength converting elements into tertiary light having a second color temperature, and
   wherein mixed light of the secondary light and the tertiary light is emitted or either the secondary light or the tertiary light is emitted in response to the input voltage level detected by the control unit.

2. The color temperature variable light emitting diode module according to claim 1, wherein the first light emitting diode group and the second light emitting diode group are configured to sequentially or selectively emit light in response to the input voltage level.

3. The color temperature variable light emitting diode module according to claim 1, further comprising a driver IC connected downstream of the first light emitting diode group and downstream of the second light emitting diode group to provide current paths when the first light emitting diode group and the second light emitting diode group emit light.

4. The color temperature variable light emitting diode module according to claim 1, further comprising:
   a first driver IC connected downstream of the first light emitting diode group wherein the first light emitting diode group is turned on to emit light when the input voltage level is higher than the first reference voltage but is lower than the second reference voltage and is turned off when the input voltage level is higher than the second reference voltage; and
   a second driver IC connected downstream of the second light emitting diode group wherein both the first light emitting diode group and the second light emitting diode group are turned on to emit light when the input voltage level is higher than the second reference voltage.

5. The color temperature variable light emitting diode module according to claim 1, wherein the light emitting diode module comprises n (where n is an integer of 3 or more) light emitting diode groups and the n light emitting diode groups comprise the first light emitting diode group and the second light emitting diode group.

6. The color temperature variable light emitting diode module according to claim 1, further comprising:
   a rectifier circuit unit applying a voltage to the first light emitting diode group and the second light emitting diode group;
   a driver IC connected downstream of the first light emitting diode group and downstream of the second light emitting diode group to control current paths; and
   a switch unit located between the rectifier circuit unit and the driver IC to switch such that either the first light emitting diode group or the second light emitting diode group does not emit light despite a change in input voltage level.

7. The color temperature variable light emitting diode module according to claim 6, wherein the switch unit comprises a first NMOS FET connected between downstream of the first light emitting diode group and the driver IC and a second NMOS FET connected between downstream of the second light emitting diode group and the driver IC; and a gate terminal of the first NMOS FET and a gate terminal of the second NMOS FET are connected to an output end of the rectifier circuit unit.

8. The color temperature variable light emitting diode module according to claim 7, wherein the gate terminal of the first NMOS FET is connected to a grounding end such that the switch unit switches to prevent the first light emitting diode group from emitting light despite a change in input voltage level.

9. The color temperature variable light emitting diode module according to claim 7, wherein the gate terminal of the second NMOS FET is connected to a grounding end such that the switch unit switches to prevent the second light emitting diode group from emitting light despite a change in input voltage level.

10. The color temperature variable light emitting diode module according to claim 1, wherein the first wavelength converting elements are disposed only on the first light emitting diode group.

11. A color temperature variable light emitting diode module that is driven when alternating current power is applied thereto, comprising:
    a substrate;
    a plurality of light emitting diode groups arranged on the substrate and comprising a first light emitting diode group emitting light at an input voltage level equal to or above a first reference voltage and a second light emitting diode group emitting light at an input voltage level equal to or above a second reference voltage higher than the first reference voltage;
    first wavelength converting elements disposed on corresponding light emitting diodes of the first light emitting diode group and converting primary light emitted from the light emitting diodes of the first light emitting diode group into secondary light having a first color temperature;
    an encapsulant comprising second wavelength converting elements and a resin, the second wavelength converting elements being disposed on the first light emitting diode group, the first wavelength converting elements, and the second light emitting diode group and converting some or all of primary light emitted from the first light emitting diode group, primary light emitted from the second light emitting diode group, and the secondary light emitted through the first wavelength converting elements into tertiary light having a second color temperature; and
    a control unit connected between the alternating current power and the plurality of light emitting diode groups to detect the input voltage level inputted by the alternating current power,
    wherein mixed light of the secondary light and the tertiary light is emitted or either the secondary light or the tertiary light is emitted in response to the input voltage level detected by the control unit.

12. The color temperature variable light emitting diode module according to claim 11, wherein the first light emitting diode group and the second light emitting diode group are configured to sequentially or selectively emit light in response to the input voltage level.

13. The color temperature variable light emitting diode module according to claim 11, further comprising:
    a first driver IC connected downstream of the first light emitting diode group wherein the first light emitting diode group is turned on to emit light when the input voltage level is higher than the first reference voltage but is lower than the second reference voltage and is turned off when the input voltage level is higher than the second reference voltage; and
    a second driver IC connected downstream of the second light emitting diode group wherein both the first light emitting diode group and the second light emitting diode group are turned on to emit light when the input voltage level is higher than the second reference voltage.

14. The color temperature variable light emitting diode module according to claim 11, further comprising:
    a rectifier circuit unit applying a voltage to the first light emitting diode group and the second light emitting diode group;
    a driver IC connected downstream of the first light emitting diode group and downstream of the second light emitting diode group to control current paths; and
    a switch unit located between the rectifier circuit unit and the driver IC to switch such that either the first light emitting diode group or the second light emitting diode group does not emit light despite a change in input voltage level.

15. A color temperature variable light emitting diode module that is driven when alternating current power is applied thereto, comprising:

a substrate;

a first light emitting diode group arranged on the substrate and comprising a plurality of light emitting diodes and first wavelength converting elements disposed on the corresponding light emitting diodes, the first light emitting diode group being configured to emit light at an input voltage level equal to or above a first reference voltage;

a second light emitting diode group arranged on the substrate and connected in series with the first light emitting diode group, the second light emitting diode group comprising a plurality of light emitting diodes, the second light emitting diode group being configured to emit light at an input voltage level equal to or above a second reference voltage higher than the first reference voltage;

an encapsulation layer encapsulating the first light emitting diode group and the second light emitting diode group and comprising second wavelength converting elements; and a control unit connected between the alternating current power and the plurality of light emitting diode groups to detect an input voltage level inputted by the alternating current power, wherein the first light emitting diode group is driven to emit light having a first color temperature when the detected input voltage level is equal to or above the first reference voltage, and the first light emitting diode group and the second light emitting diode group are driven to emit light having a second color temperature when the detected input voltage level is equal to or above the second reference voltage level higher than the first reference voltage.

16. The color temperature variable light emitting diode module according to claim 15, wherein the first wavelength converting elements comprise wavelength converting materials converting light emitted from the light emitting diodes of the first light emitting diode group into red light and the second wavelength converting elements comprise wavelength converting materials producing white light in cooperation with the second light emitting diode group.

17. The color temperature variable light emitting diode module according to claim 15, wherein the light emitting diode module comprises n (where n is an integer of 3 or more) light emitting diode groups and the n light emitting diode groups comprise the first light emitting diode group and the second light emitting diode group.

18. The color temperature variable light emitting diode module according to claim 17, wherein the first wavelength converting elements are disposed only on the light emitting diodes of the first light emitting diode group among the n (where n is an integer of 3 or more) light emitting diode groups.

19. The color temperature variable light emitting diode module according to claim 17, wherein the number of the light emitting diodes in the $n^{th}$ (where n is an integer of 3 or more) light emitting diode group is larger than the number of the light emitting diodes in the $(n-1)^{th}$ light emitting diode group.

20. The color temperature variable light emitting diode module according to claim 17, further comprising:

a driver IC controlled by the control unit in response to the input voltage level detected by the control unit to allow the first light emitting diode group and the second light emitting diode group to sequentially emit light, the driver IC being connected downstream of the first light emitting diode group and downstream of the second light emitting diode group to provide current paths when the first light emitting diode group and the second light emitting diode group emit light.

* * * * *